(12) United States Patent
Nakamura et al.

(10) Patent No.: US 6,995,633 B2
(45) Date of Patent: Feb. 7, 2006

(54) MICROMACHINE VIBRATION FILTER

(75) Inventors: Kunihiko Nakamura, Kanagawa (JP); Yoshito Nakanishi, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/474,697

(22) PCT Filed: Jan. 31, 2003

(86) PCT No.: PCT/JP03/00981

§ 371 (c)(1),
(2), (4) Date: Oct. 14, 2003

(87) PCT Pub. No.: WO03/069720

PCT Pub. Date: Aug. 21, 2003

(65) Prior Publication Data

US 2004/0124951 A1   Jul. 1, 2004

(30) Foreign Application Priority Data

Feb. 13, 2002   (JP) .......................... 2002-035274
Oct. 31, 2002   (JP) .......................... 2002-317151

(51) Int. Cl.
  *H03H 9/46* (2006.01)
  *H03H 9/52* (2006.01)
  *H03H 9/24* (2006.01)
(52) U.S. Cl. ....................... 333/186; 333/197; 333/200; 977/DIG. 1
(58) Field of Classification Search .......... 977/DIG. 1; 333/186, 197, 200
See application file for complete search history.

(56) References Cited

U.S. PATENT DOCUMENTS

| | | | | |
|---|---|---|---|---|
| 5,559,358 A | * | 9/1996 | Burns et al. ................ | 257/431 |
| 6,348,846 B1 | * | 2/2002 | von Gutfeld et al. ....... | 333/201 |
| 6,570,468 B2 | * | 5/2003 | Ma et al. .................... | 333/188 |
| 6,600,389 B2 | * | 7/2003 | Ma et al. .................... | 333/186 |
| 6,737,939 B2 | * | 5/2004 | Hoppe et al. ............... | 333/186 |
| 6,803,840 B2 | * | 10/2004 | Hunt et al. .................. | 333/186 |

FOREIGN PATENT DOCUMENTS

| | | |
|---|---|---|
| JP | 47-3459 | 2/1972 |
| JP | 62-95331 | 6/1987 |
| WO | WO 01/82479 A2 | 11/2001 |

* cited by examiner

*Primary Examiner*—Barbara Summons
(74) *Attorney, Agent, or Firm*—Browdy and Neimark, PLLC

(57) ABSTRACT

A compact high-performance mechanical vibration filter which deals with high frequency band signals. Microcolumn beams as minute mechanical vibrators are used to increase a mechanical resonance frequency. The plural microcolumn beams are arranged in an array and a common detection electrode surrounds each microcolumn beam with prescribed gaps between them, thereby preventing an output signal from becoming weak. When some of the mechanical vibrators are restrained from vibrating, it is possible to monitor and remove a noise component generated in the output signal by direct electromagnetic coupling of an input signal.

18 Claims, 12 Drawing Sheets

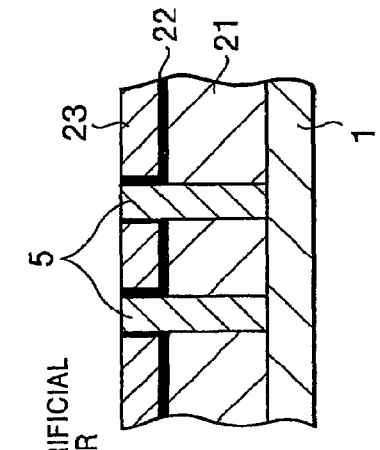
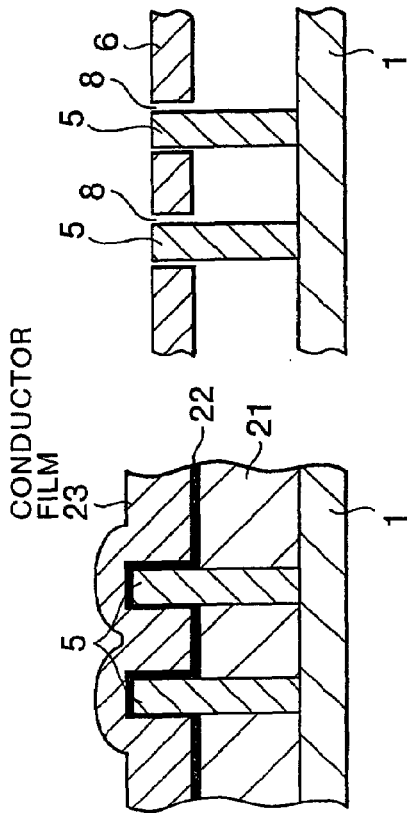
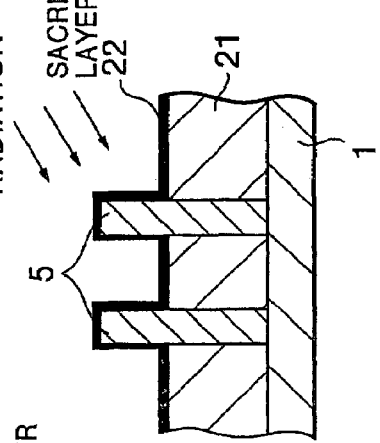
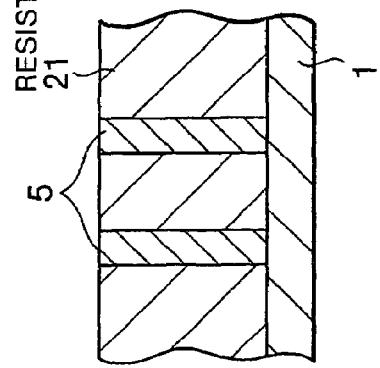
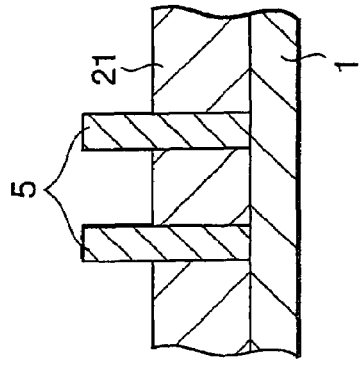

MICROMACHINE VIBRATION FILTER

BACKGROUND OF THE INVENTION

1. Field of the Invention

The present invention relates to filters used for electric circuits in radio equipment, etc. or transmission lines, and more particularly to micromachine vibration filters which provide sharp selectivity through micromechanical vibration, in highly integrated circuits for handling signals in the MHz to GHz range.

2. Description of the Related Art

FIG. 1 shows a conventional mechanical vibration filter in a simplified form (see IEEE Journal of Solid-state Circuits, Vol. 35, No. 4, pp. 512 to 526, April 2000). This filter consists of a thin-film coated silicon substrate which bears an input waveguide 104 and an output waveguide 105, beam resonators 101 and 102 which are fixed at each end with gaps of one micrometer or less from the waveguides, and a coupling beam 103 connecting the two beams. A signal entering through the input waveguide 104 is capacitively coupled with the resonator 101, which generates static electricity. Mechanical vibration occurs only when the frequency of the signal approximately coincides with the resonance frequency of an elastic structure composed of the resonators 101 and 102 and the coupling beam 103. Hence, this mechanical vibration is detected as a capacitance variation between the output waveguide 105 and the resonator 102 so that the input signal is thus filtered and picked up as an output signal.

For a doubly-supported beam with a rectangular cross section, its resonance frequency f is expressed by the following formula:

$$f = 1.03 \frac{t}{L^2} \sqrt{\frac{E}{\rho}} \quad (1)$$

where E represents elasticity modulus, $\rho$ density, t thickness, and L length.

According to the formula, if the beam material is polysilicon, E=160 Gpa, $\rho$=2.2×10³ kg/m³, L=40 $\mu$m, t=1.5 $\mu$m, then f=8.2 MHz. Therefore it is possible to make a band-pass filter with a center frequency of approximately 8 MHz. As compared with a filter based on a passive circuit having a capacitor and a coil, the filter thus structured provides high Q factor and sharp frequency selectivity.

As apparent from Formula 1, in order to make a high frequency band filter, the first thing to do is to increase the value of E/$\rho$ by changing the material. However, when E is larger, the amount of beam displacement is smaller even if the force to deflect the beam is the same, and thus it is difficult to detect the amount of beam displacement. When a static load is applied to the surface of a doubly-supported beam and d represents the amount of deflection of the center of the beam and L the length of the beam, the beam flexibility is expressed as d/L and the following proportionality relation of d/L as indicated by Formula 2 exists:

$$\frac{d}{L} \propto \frac{L^3}{t^3} \cdot \frac{1}{E} \quad (2)$$

Hence, in order to increase the resonance frequency while maintaining the value of d/L constant, a material whose density $\rho$ is low should be used because E cannot be increased. It is thus necessary to use a low-density material whose Young's modulus is equivalent to that of polysilicon. Therefore, a composite material such as CFRP (Carbon Fiber Reinforced Plastics) should be used. In this case, it is difficult to make a micromachine vibration filter through the semiconductor manufacturing process.

An alternative approach which does not use such a composite material is to change the beam size to increase the value of t·L⁻² in Formula 1. However, if t is increased and L is decreased, the value of d/L in Formula 2 as a beam flexibility indicator decreases, which means that it becomes more difficult to detect the amount of beam deflection.

Next is an explanation of the relation between log L and log t in Formulas 1 and 2. FIG. 2 is a characteristic graph showing the relation between the size of a typical mechanical vibration filter and frequency. In the graph, the line with gradient 2 illustrates the relation between log L and log t in Formula 1, and the line with gradient 1 illustrates the relation between log L and log t in Formula 2. In the graph (FIG. 2), assuming point A (which denotes the current size) as the start point, when L and t are above the gradient 2 line, the value of f increases; and on the other hand, when L and t are below the gradient 1 line, the value of d/L increases. Hence, when L and t are within the hatched region of the graph, the resonance frequency is increased while the amount of beam deflection is maintained. As FIG. 2 indicates, in order to make a high frequency mechanical vibration filter, it is necessary for both L and t to be very small. It is a sufficient condition to decrease L and t at the same scaling factor, namely decrease L and t along the gradient 1 line in order to assure that L and t fall within the hatched region of the graph (FIG. 2).

As discussed above, the use of very small micromechanical vibrators increases the resonance frequency. However, for example, in a mechanical vibration filter as shown in FIG. 1, this necessitates the input and output waveguides to come closer to each other, which might cause direct coupling of the input waveguide's electromagnetic field. This might result in leakage of an unwanted band signal, leading to superimposed noise in the output waveguide. Also, since the amplitude of beam vibration decreases, the signal which detects the vibration is weak and susceptible to disturbance.

SUMMARY OF THE INVENTION

The present invention solves the above problem and has an object to provide a compact high-performance micromachine vibration filter.

In order to achieve the object, the present invention uses an array of plural micromechanical vibrators to increase the resonance frequency and prevent micromechanical vibration detection signals from weakening. Also, the invention estimates the unfiltered input signal component leaking directly into a detection circuit and cancels the component in order to extract only the output signal component arising from vibration of the micromechanical vibrators.

According to one aspect of the present invention, there is provided a micromachine vibration filter which comprises: a plurality of beam or coil micromechanical vibrators arranged in an array in an electromagnetic waveguide or an electromagnetic field in its vicinity; and a detection circuit for detecting a signal which arises when the plural micromechanical vibrators vibrate at their inherent resonance frequency through interaction with an electromagnetic field.

The use of plural micromechanical vibrators arranged in an array increases the resonance frequency and prevents a micromechanical vibration detection signal from being very weak.

According to another aspect of the invention, in the micromachine vibration filter, the micromechanical vibrators are conductive beams and vibrate through interaction with an electromagnetic wave field. Thus, conductive beams may be used as micromechanical vibrators.

According to another aspect of the invention, in the micromachine vibration filter, the micromechanical vibrators are dielectric beams and vibrate through interaction with an electromagnetic wave field. Thus, dielectric beams may be used as micromechanical vibrators.

According to another aspect of the invention, in the micromachine vibration filter, the micromechanical vibrators are magnetic beams and vibrate through interaction with an electromagnetic wave field. Thus, magnetic beams may be used as micromechanical vibrators.

According to another aspect of the invention, in the micromachine vibration filter, the micromechanical vibrators are conductor coils and vibrate through interaction between magnetic fields generated by the conductor coils. Thus, conductor coils may be used as vibrators.

According to another aspect of the invention, in the micromachine vibration filter, the conductor coils are connected in series and arranged so as for magnetic fluxes inside the conductor coils to leak at their connections. Thus, as an electric current flows through the conductor coils due to electromagnetic waves, the coils vibrate.

According to another aspect of the invention, in the micromachine vibration filter, impedance variation with vibration of the conductor coils is detected. Thus, vibration of the conductor coils is detected as an impedance variation.

According to another aspect of the invention, in the micromachine vibration filter, the micromechanical vibrators are conductive and the detection circuit is an electrode facing the micromechanical vibrators and detects vibration of the micromechanical vibrators according to capacitance variation between the micromechanical vibrators and the electrode. Thus, vibration of the micromechanical vibrators is detected as a capacitance variation.

According to another aspect of the invention, in the micromachine vibration filter, holes are made through a surface of the electrode and the micromechanical vibrators partially stand inside the holes in an eccentric position with respect to a center of the holes. Since their center is off the center of the holes, static electricity in the narrowest gap between the electrode and each micromechanical vibrator vibrates the micromechanical vibrator.

According to another aspect of the invention, in the micromachine vibration filter, the detection circuit optically detects vibration of the micromechanical vibrators. Thus, vibration of the micromechanical vibrators is detected as a variation in the amount of light received.

According to another aspect of the invention, in the micromachine vibration filter, there are a plurality of detection circuits as mentioned above and output signals from the plural detection circuits are summed up. Thus, the output signal intensity is increased.

According to another aspect of the invention, in the micromachine vibration filter, the detection circuit has first means to pick up signals from micromechanical vibrators which can vibrate, second means to pick up signals from micromechanical vibrators which are restrained from vibrating, and third means to take a difference between an output signal from the first means and an output signal from the second means. In this constitution, the input signal component which may leak directly into the detection circuit without being filtered is estimated and canceled so that only the output signal component arising from vibration of the micromechanical vibrators is extracted.

According to another aspect of the invention, in the micromachine vibration filter, there are a plurality of micromechanical vibrators as mentioned above with different resonance frequencies and an output signal from the detection circuit is selected. Thus, a frequency of the electromagnetic wave is selected by selecting an output signal from the detection circuit.

According to another aspect of the invention, in the micromachine vibration filter, the micromechanical vibrators have different sizes and thus different resonance frequencies. Hence, it is easy to obtain micromechanical vibrators with different resonance frequencies.

According to another aspect of the invention, in the micromachine vibration filter, the micromechanical vibrators have different elasticity moduli and thus different resonance frequencies. Hence it is easy to obtain micromechanical vibrators with different resonance frequencies.

According to another aspect of the invention, in the micromachine vibration filter, the micromechanical vibrators have different stresses and thus different resonance frequencies. Hence it is easy to obtain micromechanical vibrators with different resonance frequencies.

According to another aspect of the invention, in the micromachine vibration filter, direct current bias voltage is applied to a signal conveyed through the waveguide to generate a certain stress in the micromechanical vibrators. Hence it is easy to obtain micromechanical vibrators with different stresses.

According to another aspect of the invention, in the micromachine vibration filter, the micromechanical vibrators are carbon coils with a diameter in a range from one micrometer to scores of micrometers. This means that the micromechanical vibrators can be manufactured using existing technology.

According to another aspect of the invention, in the micromachine vibration filter, the micromechanical vibrators are ultrathin silicon wires with a diameter in a range from one nanometer to scores of nanometers. This means that the micromechanical vibrators can be manufactured using existing technology.

According to another aspect of the invention, in the micromachine vibration filter, the micromechanical vibrators are made of carbon nanotubes with a diameter in a range from one nanometer to scores of nanometers. This means that the micromechanical vibrators can be manufactured using existing technology.

As can be understood from the foregoing, since micromechanical vibrators are used, a compact filter with sharp selectivity which corresponds to a range from MHz to GHz can be realized. Also, since the mechanical vibrators are arranged in an array, a drop in the filter output signal intensity can be prevented.

When some of the micromechanical vibrators are restrained from vibrating, it is possible to monitor the component of noise generated by input signal's direct electromagnetic interference with output signal and thus remove the noise component. Therefore, a compact, high-performance mechanical vibration filter can be realized.

When the micromechanical vibrators are conductor coils, they vibrate through interaction between magnetic fields generated by the conductor coils. Vibration of the conductor coils can be detected as an impedance variation. Also, the use of an optical detection means for the micromechanical vibrators prevents input electromagnetic waves from directly interfering with the detection circuit.

BRIEF DESCRIPTION OF THE DRAWINGS

The invention will be more particularly described with reference to the accompanying drawings, in which:

FIGS. 7A to 7F show the steps of making the filter area according to the first embodiment of the present invention;

DESCRIPTION OF THE PREFERRED EMBODIMENTS

Next, preferred embodiments of the present invention will be described referring to FIG. 3 to FIG. 12.

(Embodiment 1)

Figure 1:
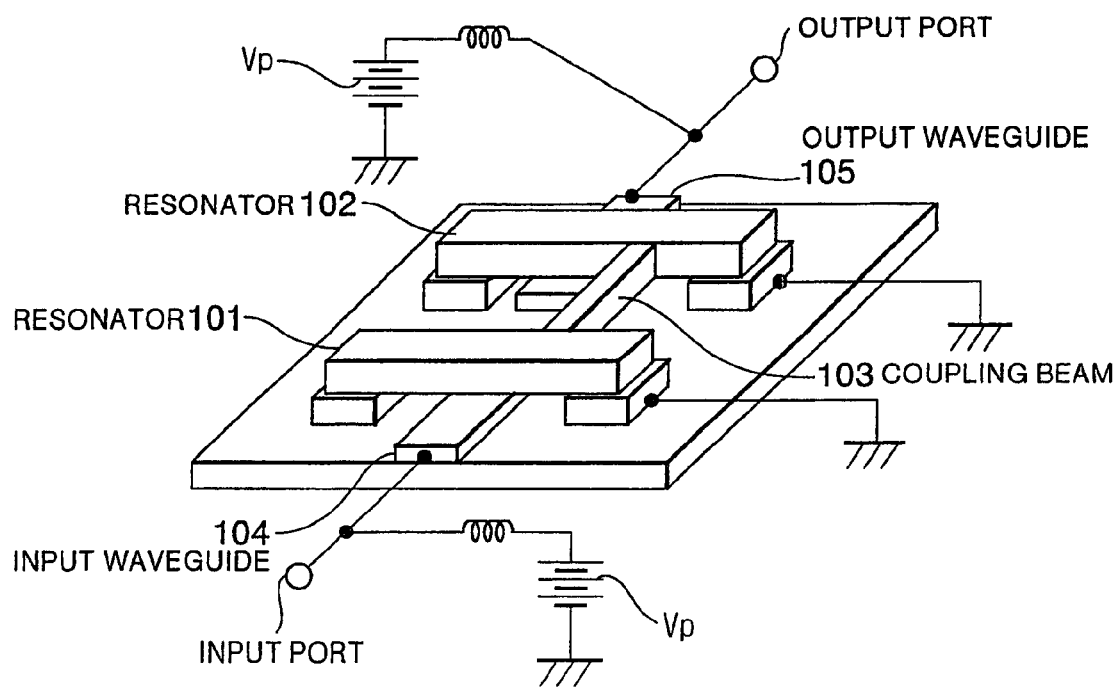
FIG. 1 is a perspective view outlining a conventional mechanical vibration filter.
Figure 2:
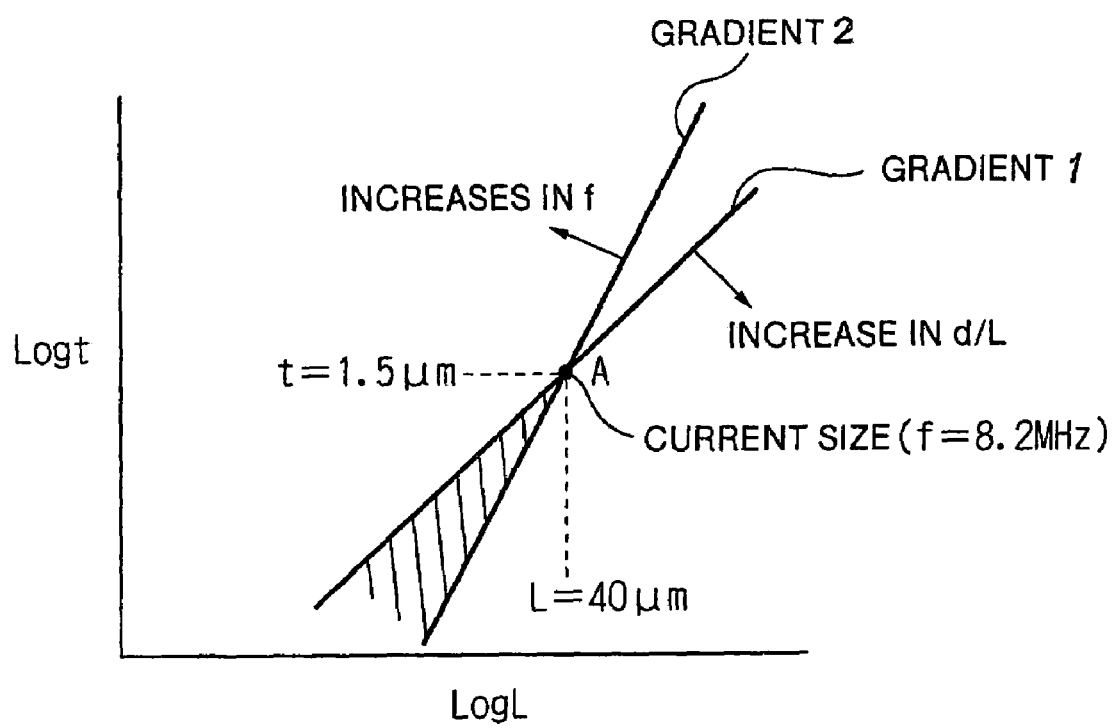
FIG. 2 is a characteristic graph showing the relation between the size of a typical mechanical vibration filter and frequency.
Figure 3:
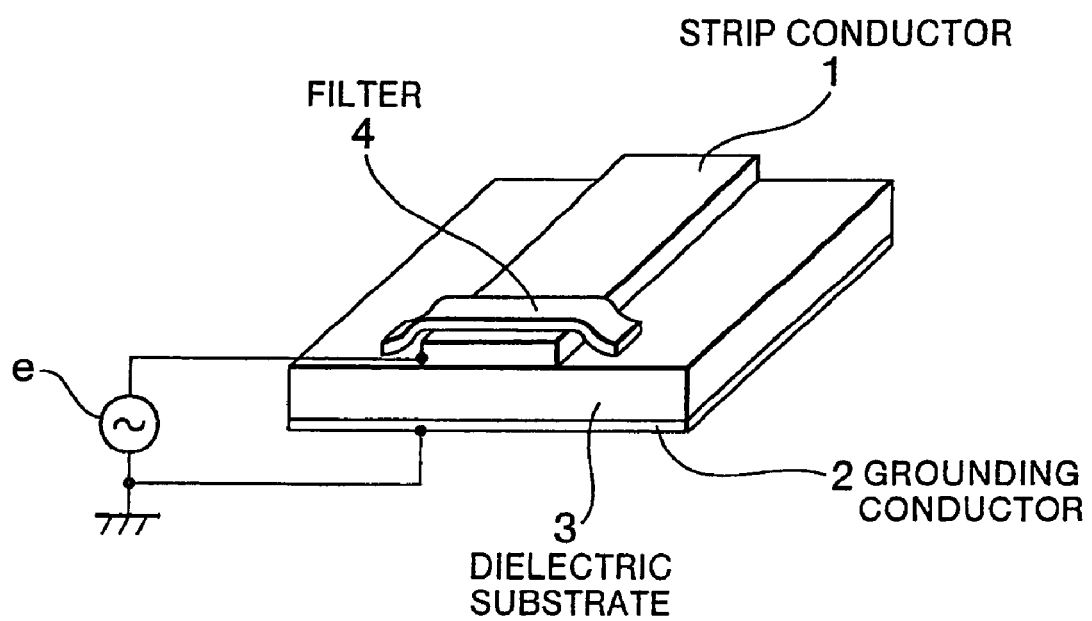
FIG. 3 is a perspective view outlining a micromachine vibration filter according to a first embodiment of the present invention.

FIG. 3 outlines the micromachine vibration filter according to the first embodiment of the present invention. The waveguide is of the microstrip type: it has a strip conductor 1 and a grounding conductor 2 with a dielectric substrate 3 between them, where there is a filter area 4 above part of the strip conductor 1, and a signal source e is connected between the strip conductor 1 and the grounding conductor 2.

Figure 4:
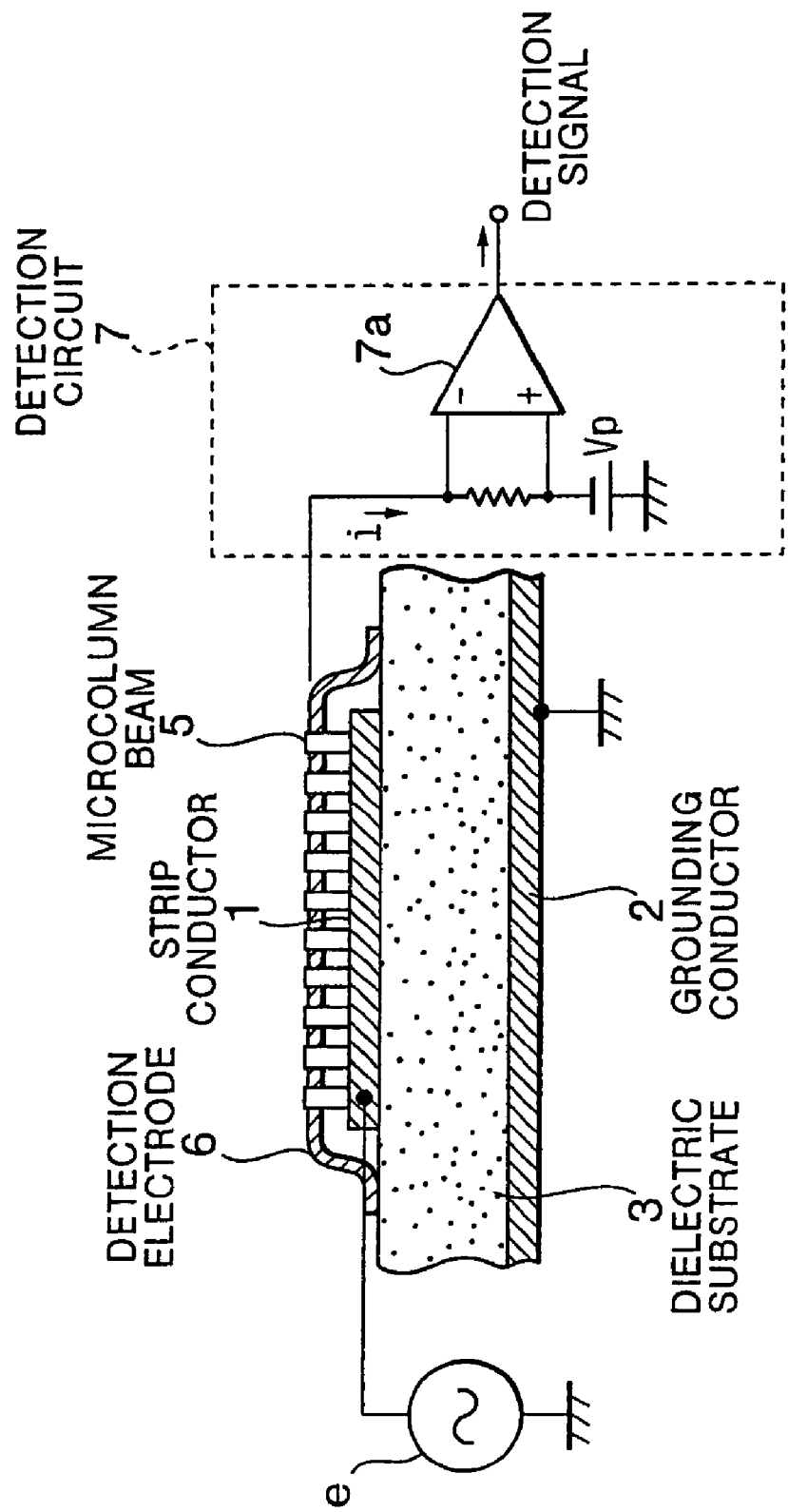
FIG. 4 is a sectional side view of a filter area according to the first embodiment of the present invention.
Figure 5:
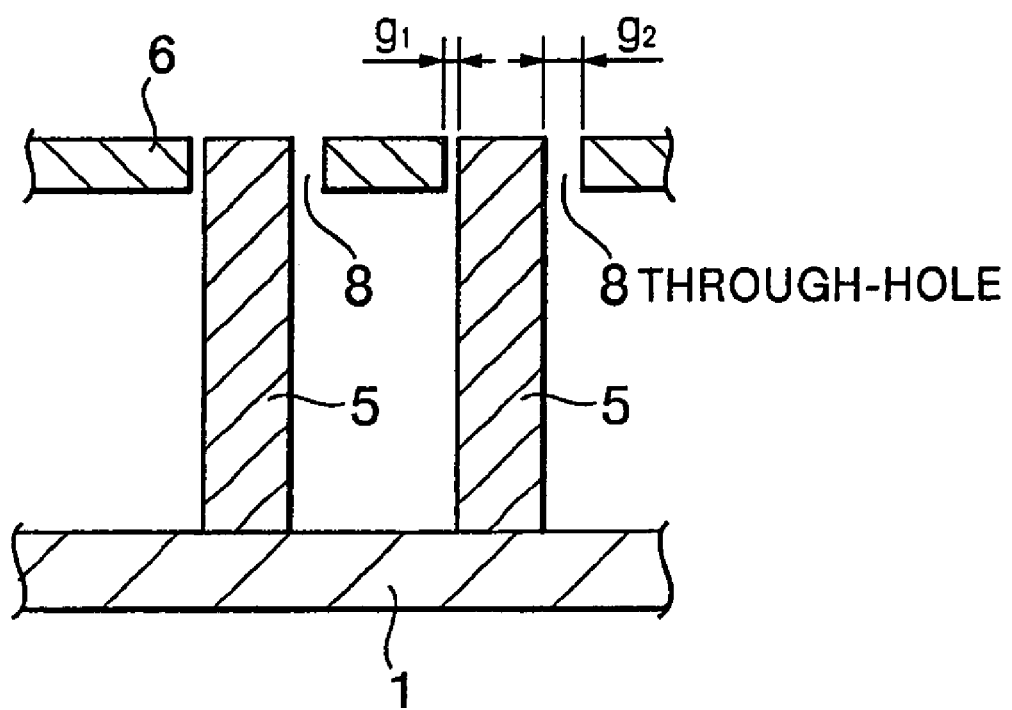
FIG. 5 is an enlarged fragmentary sectional view of the filter area according to the first embodiment of the present invention.

FIG. 4 is a sectional side view of the filter area 4. On the strip conductor 1 is an array of microcolumn conductor beams 5 (which are each singly supported, or supported at one end) standing together. As illustrated in FIG. 5 (enlarged fragmentary sectional side view) and FIG. 6 (enlarged fragmentary top view), there is a detection electrode 6 surrounding the top end of each microcolumn beam 5 with gaps $g_1$ and $g_2$ between them. In this first embodiment, the detection electrode 6, which is a flat plate which has through-holes 8 each surrounding one of the microcolumn beams 5, converts vibrations of all the microcolumn beams 5 into an electric signal. A comparator 7a in a detection circuit 7 picks it up as a detection signal.

Figure 6:
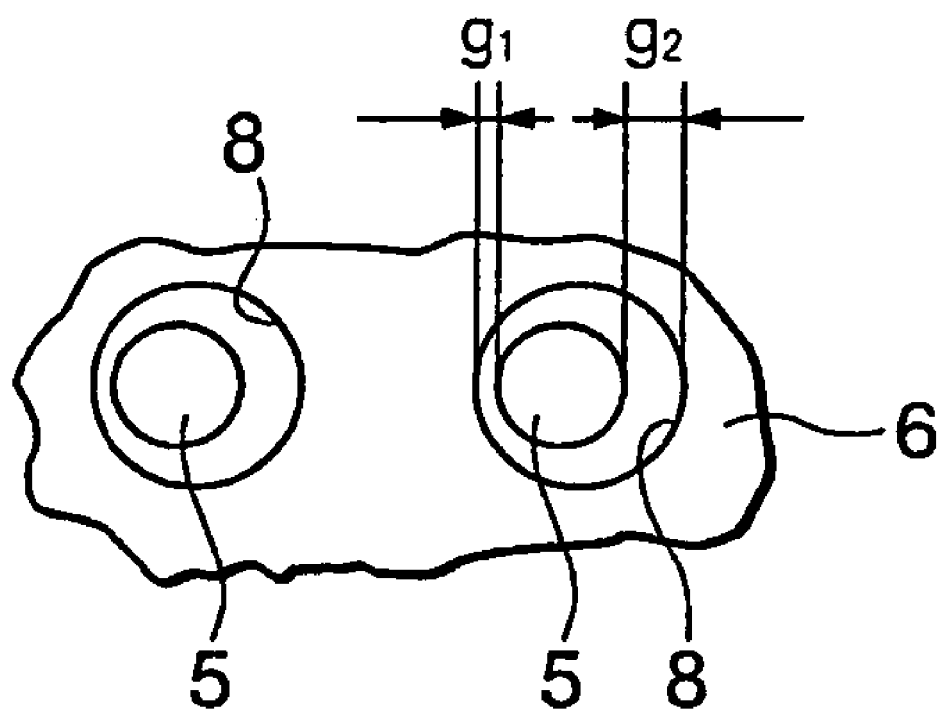
FIG. 6 is an enlarged fragmentary top view of the filter area according to the first embodiment of the present invention.

As indicated in FIG. 5 and FIG. 6, the center of each through-hole 8 is off the center of the corresponding microcolumn beam 5 ($g_1 < g_2$) so that an electric potential difference is generated between the detection electrode 6 and the microcolumn beam 5. Due to this potential difference, static electricity causes the microcolumn beam 5 to bend towards the smaller gap, or gap $g_1$ in a way to decrease the gap. Hence, as the distance between the microcolumn beam 5 and the detection electrode 6 changes, out of the waveguide potential frequency signal components, the component in the vicinity of the inherent resonance frequency of the microcolumn beam 5 is converted into an electric signal as a capacitance variation between them and the signal is outputted through the detection circuit 7 (FIG. 4). Although the detection signal arising from vibration of each microcolumn beam 5 is small, the detection electrode 6 sums up the signals from the individual beams and thus prevents a drop in the output signal level.

An array of microcolumn beams 5 as minute vibrating beams can be made using the RIE process for etching a thin silicon oxide film or the LIGA process as a combination of deep X-ray lithography, electroplating and molding techniques. FIGS. 7A to 7F show the steps of making the structure as shown in FIG. 5. At the step shown in FIG. 7A, metal microcolumn beams 5 are formed on the strip conductor 1 using the LIGA process. The height of the microcolumn beams 5 and the height of the resist layer 21 in the LIGA process are made identical by surface grinding so that they are flush with each other. At the step shown in FIG. 7B, the height of the resist layer 21 is decreased by ashing. Then, as shown in FIG. 7C, a sacrificial layer 22 of $SiO_2$ or the like is formed over them by sputtering or a similar technique. In this process, the sacrificial layer is irradiated obliquely from above as indicated by the arrows in the figure so that the sacrificial layer around the microcolumn beams 5 has an uneven film thickness distribution. Next, as shown in FIG. 7D, a conductor film 23 of polycrystal silicon or the like is formed over them using the LPCVD process (Low Pressure Chemical Vapor Deposition); and as shown in FIG. 7E, they are made flush with each other by surface grinding. Lastly, the resist 21 is removed by ashing and the sacrificial layer ($SiO_2$) 22 is removed by hydrofluoric acid. Through these steps, the structure as shown in FIG. 7F is completed in which the detection electrode 6 lies with its through holes 8 surrounding the top ends of the microcolumn beams 5, as shown in FIG. 5. It should be noted that the sacrificial layer 22 has an uneven thickness distribution as shown in FIG. 7C and thus each microcolumn beams 5 is eccentric with respect to the surrounding through-hole 8 of the detection electrode 6. The static electricity generated in the smallest gap between the detection electrode 6 and the microcolumn beam 5 causes the beam 5 to vibrate.

The resonance frequency of a singly-supported microcolumn beam with diameter d and length L is expressed by Formula 3 given below. When microcolumn beams with aspect ratio L/d=10 are formed using silicon oxide (E=70 GPa, $\rho=2.2\times10^3$ kg/m$^3$), f equals 800 MHz at diameter d=9.9 nm and f equals 1.5 GHz at diameter d=5.3 nm. By use of such nanometer size microcolumn beams, it is possible to make a filter which can deal with a frequency band of several GHz as used in mobile phones. It is possible to make nanometer size vibrating beams to increase the resonance frequency, using ultra-thin silicon wires (one nanometer to scores of nanometers in diameter) as reported by H. Kohno, S. Takeda et al in the Journal of Electron Microscopy 49 (2000), pp. 275 to 280.

$$f = 0.140 \frac{d}{L^2} \sqrt{\frac{E}{\rho}} \quad (3)$$

When cylindrical (hollow) beams are used as vibrating beams instead of column (solid) beams, the resonance frequency is expressed by Formula 4 given below where $D_2$ represents the outer diameter of a cylindrical beam and $D_1$ represents its inner diameter. In this case, the d/L ratio is expressed by Formula 5 given below where d represents the deflection of the beam, d, which is caused by the load concentrated on its top end, and L represents the length of the beam. This suggests that, as the wall thickness of the cylinder decreases, namely $D_1$ becomes closer to $D_2$, the resonance frequency increases while the relation of Formula 5 as an indicator for beam flexibility is retained. Therefore, the resonance frequency can be further increased by use of carbon nanotubes with a diameter in the range from one nanometer to scores of nanometers for the ultimate microstructure of lightweight material such as carbon fiber.

$$f = 0.140 \frac{\sqrt{D_2^2 + D_1^2}}{L^2} \sqrt{\frac{E}{\rho}} \quad (4)$$

$$\frac{d}{L} \propto \frac{L^2}{D_2^4 - D_1^4} \cdot \frac{1}{E} \quad (5)$$

Thus, in this embodiment, the plural microcolumn beams 5 as vibrators are arranged in an array to increase the resonance frequency and the common detection electrode 6 lies around each microcolumn beam 5 and sums up individual signals to prevent the detection signal from becoming weak. Therefore, a compact high-performance micromachine vibration filter is provided.

(Embodiment 2)

Figure 8:
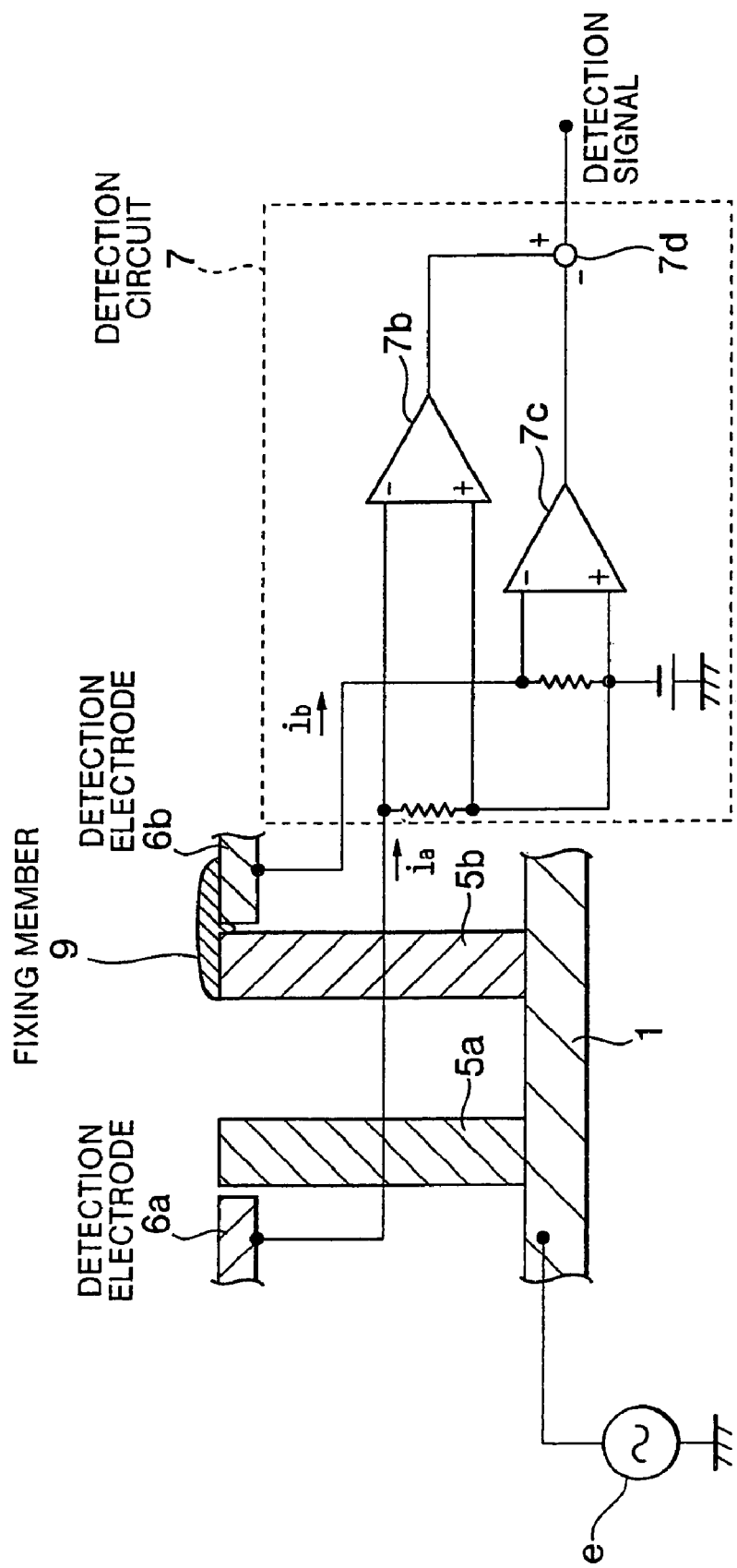
FIG. 8 is a fragmentary sectional side view of the filter area in a micromachine vibration filter according to a second embodiment of the present invention.
Figure 9:
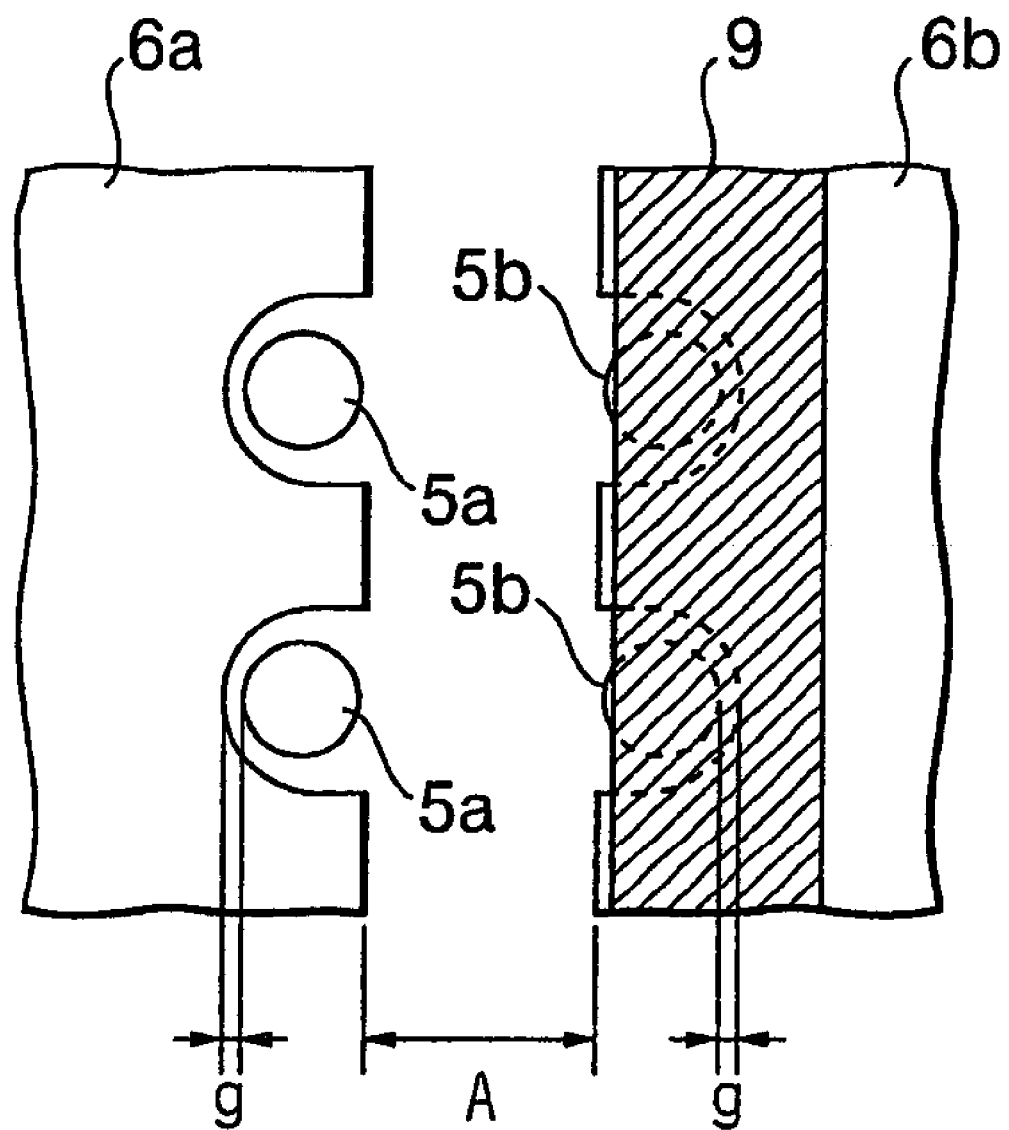
FIG. 9 is a fragmentary top view of a filter area according to the second embodiment of the present invention.

FIG. 8 shows the second embodiment of the present invention. The general structure of this embodiment is almost the same as that of the first embodiment shown in FIG. 3. However, this embodiment is different in that two microcolumns facing each other (a microcolumn 5a and a microcolumn 5b) make up a pair and such pairs are parallel to each other and arranged in an array; the microcolumns 5a and a common detection electrode 6a constitute a capacitor and the top ends of the microcolumns 5b are fixed to a common detection electrode 6b through a fixing member 9. FIG. 9 shows the structure as viewed from above. The microcolumns 5a and 5b respectively face the detection electrodes 6a and 6b with a gap g and the detection electrodes 6a and 6b face each other with spacing A between them. The detection electrode 6a is connected to a first comparator 7b in a detection circuit 7 and the detection electrode 6b to a second comparator 7c in the circuit 7.

A signal from a signal source e which flows through the strip conductor 1 causes the microcolumn beams 5a to vibrate. Then, the vibration causes an electric current ia to flow from the detection electrode 6a. Superimposed on this current is an unwanted component flowing from the strip conductor 1, which is electromagnetically coupled with the detection electrode 6a without being exposed to vibration of the microcolumn beams 5a. When the specific dielectric constant of the fixing member 9 is equivalent to that of the ambient air, only an equivalent unwanted component is superimposed at the detection electrode 6b. Hence, in the detection circuit 7, the signal from the detection electrode 6a is picked up by the first comparator 7b and the signal from the detection electrode 6b is picked up by the second comparator 7c and the output from the comparator 7c is subtracted from the output from the comparator 7b by an adder 7d so as to pick up only the signal component arising from vibration of the microcolumn beams 5a as a detection signal.

As mentioned above, in the second embodiment, out of two lines of microcolumn beams 5 facing each other which are arranged in an array, the microcolumn beams 5b in one line are restrained from vibrating while the microcolumn beams 5a in the other line can vibrate; and the detection signal from the restrained microcolumn beams 5b is subtracted from that from the vibratable microcolumn beams 5a so that an unwanted signal component caused by electromagnetic waves coupled directly with the detection circuit is suppressed and only a signal component arising from vibration of the microcolumn beams 5 is extracted. Therefore, a compact, high-performance mechanical vibration filter can be realized. The structure as shown in FIG. 8 according to the second embodiment can also be made by following the steps shown in FIGS. 7A to 7F according to the first embodiment. The fixing member 9 as used in the second embodiment can be formed by patterning a silicon nitride film on the electrode/beam top surface shown in FIG. 7F.

(Embodiment 3)

Figure 10:
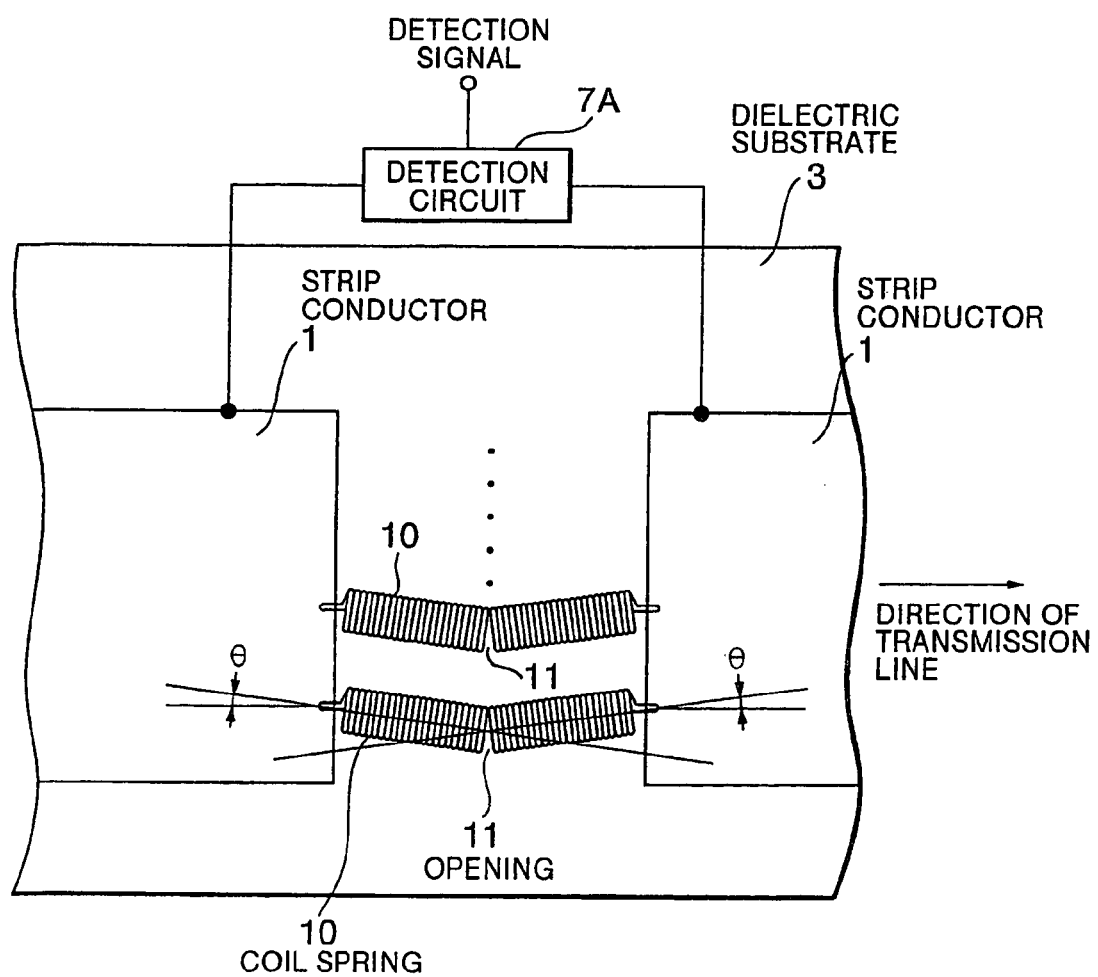
FIG. 10 is a fragmentary top view of a filter area according to a third embodiment of the present invention.
Figure 11:
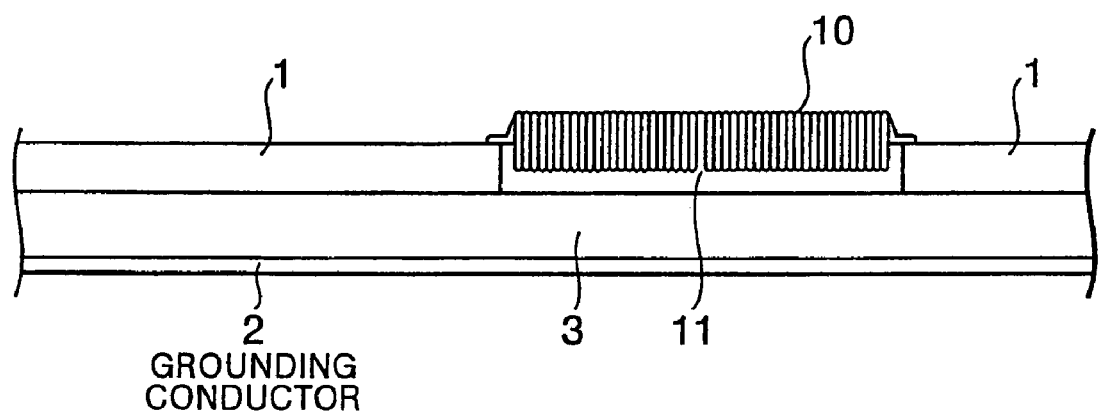
FIG. 11 is a fragmentary side view of the filter area according to the third embodiment of the present invention.

FIG. 10 and FIG. 11 are respectively a top view and a side view of a micromachine vibration filter according to the third embodiment of the present invention. In this embodiment, part of the strip conductor 1 is replaced by an array of plural coil springs 10 as micromechanical vibrators which are connected in parallel. As illustrated in FIG. 10, both ends of the coil springs 10 are fixed at an angle of θ with respect to the direction of the transmission line. The coil springs 10 are slightly bent in the center in a way to create an opening 11. As an electric current flows through each coil spring 10, the internal magnetic flux leaks through the opening 11. However, there is a force to maximize the magnetic energy inside the coil spring 10 so the coil spring 10 tries to close the opening 11 to straighten itself. Due to this force, the coil spring 10 vibrates at its inherent resonance frequency. This mechanical vibration is detected as a variation in the coil spring self-inductance by a detection circuit 7A connected with the strip conductors 1 at both ends of the coil spring 10, and the output signal thus filtered becomes a detection signal.

The resonance frequency of these coil springs 10 can be increased by use of fine carbon coils with a diameter in the range from one micrometer to scores of micrometers which are purified by the chemical vapor deposition method as reported by S. Motojima et al in "Three-dimensional vapor growth mechanism of carbon microcoils" (J. Mater, Res., Vol. 14, No. 11, pp. 4329 to 4336 (1999)).

(Embodiment 4)

Figure 12:
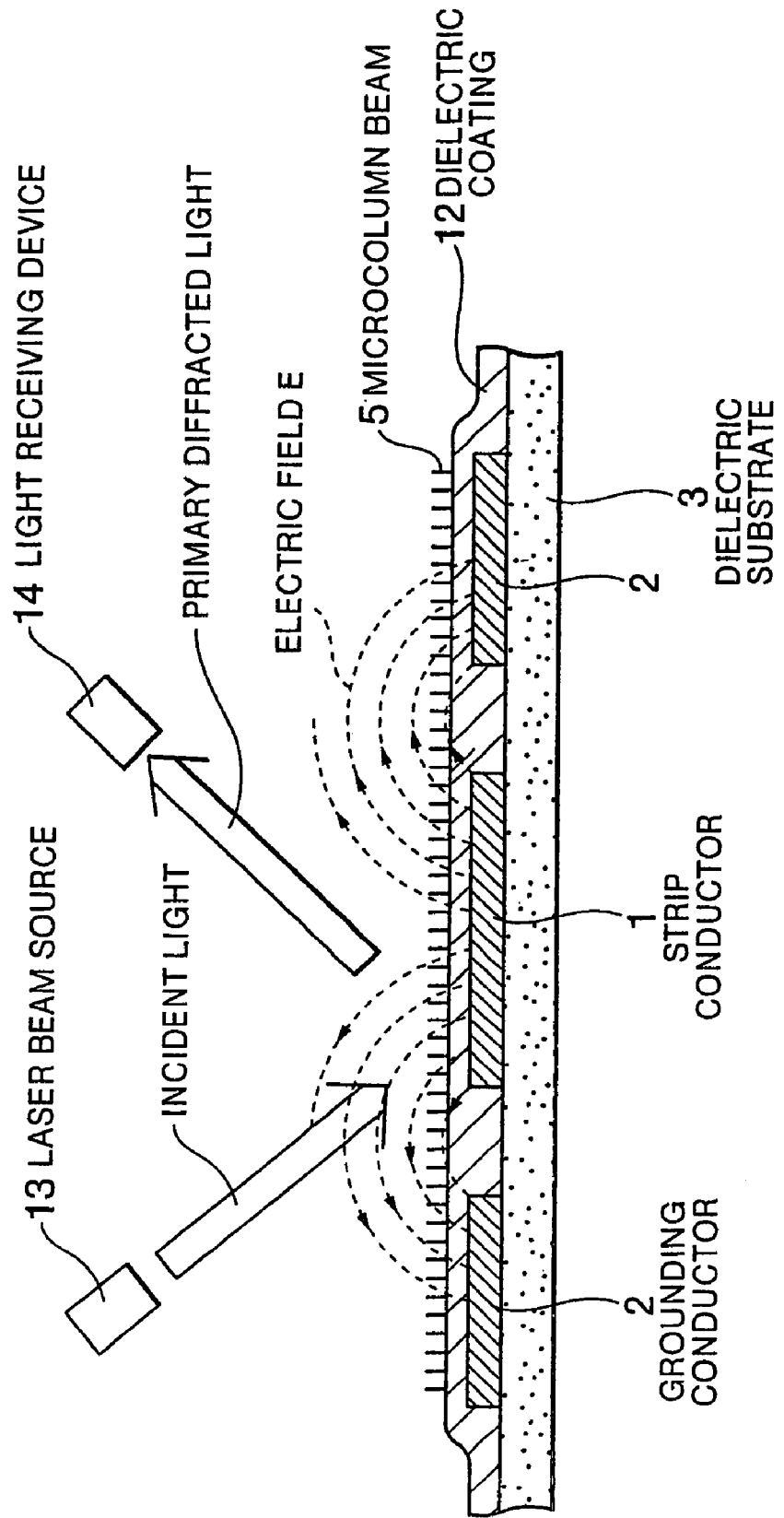
FIG. 12 is a fragmentary sectional side view of a filter area in a micromachine vibration filter according to a fourth embodiment of the present invention.

FIG. 12 is a sectional side view of a micromachine vibration filter according to the fourth embodiment of the present invention. In this embodiment, a coplanar waveguide type strip conductor 1 and grounding conductors 2 are located in parallel to each other on a dielectric substrate 3 and a dielectric coating 12 covering the strip conductor 1 and grounding conductors 2 lies over the dielectric substrate 3. On the dielectric coating 12, longitudinally polarized microcolumn beams 5 are standing in an array. A detection circuit consists of a laser beam source 13 and a light receiving device 14.

As an electric current flows through the strip conductor 1, an electric filed E is generated as shown in the figure and most electromagnetic waves in the electric field E cross the microcolumn beams 5 obliquely. Since there is a force to orient the polarized microcolumn beams 5 towards the electric field E, the microcolumn beams 5 vibrate at their inherent resonance frequency. Laser beam from the laser beam source 13 is cast on a spot where the angle of the microcolumn beam 5's swing is the largest and the light receiving device 14 detects primary diffracted light. As the microcolumn beams 5 swing, the spot where diffracted light is focused varies; so vibration of the microcolumn beams 5 is detected according to variation in the amount of light received.

As mentioned above, according to the fourth embodiment, light is used to detect vibration of the microcolumn beams 5 so as to prevent input electromagnetic waves from interfering with the detection circuit, and thus a compact, high-performance micromachine vibration filter is realized.

The same effects as above can be achieved by use of microbeams made of magnetic material magnetized longitudinally and letting them vibrate by interaction with a magnetic field.

For the purpose of illustration of the present invention, the preferred embodiments as shown in the accompanying drawings have been described. However, the invention is not limited thereto and those skilled in the art may easily make modifications or variations without departing from the sprit and scope of the invention. The present invention includes such modifications and variations.

What is claimed is:

1. A micromachine vibration filter comprising:
   a plurality of beam or coil micromechanical vibrators arranged in an array in an electromagnetic waveguide or an electromagnetic field in its vicinity; and
   a detection circuit for detecting a signal which arises when said plural micromechanical vibrators vibrate at their inherent resonance frequency through interaction with an electromagnetic field;
   wherein said micromechanical vibrators are dielectric beams and vibrate through interaction with an electromagnetic wave field.

2. The micromachine vibration filter according to claim 1, wherein said detection circuit optically detects vibration of said micromechanical vibrators.

3. The micromachine vibration filter according to claim 1, wherein there are a plurality of said detection circuits and output signals from said plural detection circuits are summed up.

4. The micromachine vibration filter according to claim 1, wherein there are a plurality of said micromechanical vibrators with different resonance frequencies and a frequency of the electromagnetic wave is selected by selecting an output signal from said detection circuit.

5. The micromachine vibration filter according to claim 4, wherein said micromechanical vibrators have different sizes and thus different resonance frequencies.

6. The micromachine vibration filter according to claim 4, wherein said micromechanical vibrators have different stresses and thus different resonance frequencies.

7. The micromachine vibration filter according to claim 6, wherein direct current bias voltage is applied to a signal conveyed through said waveguide to generate a certain stress in said micromechanical vibrators.

8. The micromachine vibration filter according to claim 1, wherein said detection circuit is an electrode facing said micromechanical vibrators and detects vibration of said micromechanical vibrators according to capacitance variation between said micromechanical vibrators and said electrode.

9. The micromachine vibration filter according to claim 1, wherein said micromechanical vibrators are made of carbon nanotubes with a diameter in a range from one nanometer to scores of nanometers.

10. A micromachine vibration filter, comprising:
    a plurality of beam or coil micromechanical vibrators arranged in an array in an electromagnetic waveguide or an electromagnetic field in its vicinity; and
    a detection circuit for detecting a signal which arises when said plural micromechanical vibrators vibrate at their inherent resonance frequency through interaction with an electromagnetic field;
    wherein said micromechanical vibrators are magnetic beams and vibrate through interaction with an electromagnetic wave field.

11. A micromachine vibration filter, comprising:
    a plurality of beam or coil micromechanical vibrators arranged in an array in an electromagnetic waveguide or an electromagnetic field in its vicinity; and
    a detection circuit for detecting a signal which arises when said plural micromechanical vibrators vibrate at their inherent resonance frequency through interaction with an electromagnetic field;
    wherein said micromechanical vibrators are conductor coils and vibrate through interaction between magnetic fields generated by said conductor coils.

12. The micromachine vibration filter according to claim 11, wherein said conductor coils are connected in series and arranged so as for magnetic fluxes inside said conductor coils to leak at their connections.

13. The micromachine vibration filter according to claim 12, wherein impedance variation with vibration of said conductor coils is detected.

14. A micromachine vibration filter, comprising:
    a plurality of beam or coil micromechanical vibrators arranged in an array in an electromagnetic waveguide or an electromagnetic field in its vicinity; and
    a detection circuit for detecting a signal which arises when said plural micromechanical vibrators vibrate at their inherent resonance frequency through interaction with an electromagnetic field;
    wherein said micromechanical vibrators are conductive and said detection circuit is an electrode facing said micromechanical vibrators and detects vibration of said micromechanical vibrators according to capacitance variation between said micromechanical vibrators and said electrode, and
    wherein holes are made through a surface of said electrode and said micromechanical vibrators partially stand inside said holes in an eccentric position with respect to a center of said holes.

15. A micromachine vibration filter, comprising:
    a plurality of beam or coil micromechanical vibrators arranged in an array in an electromagnetic waveguide or an electromagnetic field in its vicinity; and
    a detection circuit for detecting a signal which arises when said plural micromechanical vibrators vibrate at their inherent resonance frequency through interaction with an electromagnetic field, wherein there are a plurality of said micromechanical vibrators with different resonance frequencies and a frequency of the electromagnetic wave is selected by selecting an output signal from said detection circuit, and wherein said micromechanical vibrators have different elasticity moduli and thus different resonance frequencies.

16. A micromachine vibration filter, comprising:

a plurality of beam or coil micromechanical vibrators arranged in an array in an electromagnetic waveguide or an electromagnetic field in its vicinity; and a detection circuit for detecting a signal which arises when said plural micromechanical vibrators vibrate at their inherent resonance frequency through interaction with an electromagnetic field;

wherein said detection circuit has first means to pick up signals from micromechanical vibrators which can vibrate, second means to pick up signals from micromechanical vibrators which are restrained from vibrating, and third means to take a difference between an output signal from said first means and an output signal from said second means.

17. A micromachine vibration filter, comprising:

a plurality of beam or coil micromechanical vibrators arranged in an array in an electromagnetic waveguide or an electromagnetic field in its vicinity; and a detection circuit for detecting a signal which arises when said plural micromechanical vibrators vibrate at their inherent resonance frequency through interaction with an electromagnetic field;

wherein said micromechanical vibrators are ultrathin silicon wires with a diameter in a range from one nanometer to scores of nanometers.

18. A micromachine vibration filter, comprising:

a plurality of beam or coil micromechanical vibrators arranged in an array in an electromagnetic waveguide or an electromagnetic field in its vicinity; and a detection circuit for detecting a signal which arises when said plural micromechanical vibrators vibrate at their inherent resonance frequency through interaction with an electromagnetic field;

wherein said micromechanical vibrators are carbon coils with a diameter in a range from one micrometer to scores of micrometers.

* * * * *